United States Patent
Schmitt

(10) Patent No.: US 9,488,464 B1
(45) Date of Patent: Nov. 8, 2016

(54) SWEPT MODE-HOPPING LASER SYSTEM, METHODS, AND DEVICES FOR FREQUENCY-DOMAIN OPTICAL COHERENCE TOMOGRAPHY

(71) Applicant: Joseph M. Schmitt, Andover, MA (US)

(72) Inventor: Joseph M. Schmitt, Andover, MA (US)

(73) Assignee: LightLab Imaging, Inc., Westford, MA (US)

( * ) Notice: Subject to any disclaimer, the term of this patent is extended or adjusted under 35 U.S.C. 154(b) by 95 days.

(21) Appl. No.: 14/045,537

(22) Filed: Oct. 3, 2013

Related U.S. Application Data

(63) Continuation of application No. 13/195,234, filed on Aug. 1, 2011, now Pat. No. 8,582,109.

(51) Int. Cl.
*G01B 9/02* (2006.01)
(52) U.S. Cl.
CPC ................ *G01B 9/02091* (2013.01)
(58) Field of Classification Search
CPC ............ G01B 9/02091; G01B 9/0209; G01B 9/02041; G01B 9/02083
USPC .................................................. 356/479, 497
See application file for complete search history.

(56) References Cited

U.S. PATENT DOCUMENTS

| | | | |
|---|---|---|---|
| 5,321,501 A | 6/1994 | Swanson et al. | |
| 5,459,570 A | 10/1995 | Swanson et al. | |
| 5,465,147 A | 11/1995 | Swanson | |
| 5,509,093 A | 4/1996 | Miller et al. | |
| 5,619,368 A | 4/1997 | Swanson | |
| 5,748,598 A | 5/1998 | Swanson et al. | |
| 5,784,352 A | 7/1998 | Swanson et al. | |
| 5,956,355 A | 9/1999 | Swanson et al. | |
| 6,111,645 A | 8/2000 | Tearney et al. | |
| 6,134,003 A | 10/2000 | Tearney et al. | |
| 6,160,826 A | 12/2000 | Swanson et al. | |
| 6,191,862 B1 | 2/2001 | Swanson et al. | |
| 6,282,011 B1 | 8/2001 | Tearney et al. | |
| 6,421,164 B2 | 7/2002 | Tearney et al. | |
| 6,445,939 B1 | 9/2002 | Swanson et al. | |

(Continued)

OTHER PUBLICATIONS

Chinn et al., "Optical coherence tomography using a frequency-tunable optical source", Opt. Lett., vol. 22: 340-342 (1997).

(Continued)

*Primary Examiner* — Tarifur Chowdhury
*Assistant Examiner* — Jonathon Cook
(74) *Attorney, Agent, or Firm* — K&L Gates LLP

(57) ABSTRACT

In part, the invention relates to frequency-domain optical coherence tomography system. The system includes a tunable laser comprising a laser output for transmitting laser light and a laser cavity having a length L, a gain element disposed within the laser cavity; a tunable wavelength selective element disposed within the laser cavity; a reference reflector disposed outside of the laser cavity; an interferometer in optical communication with the laser output and the reference reflector, wherein the interferometer is configured to transmit a portion of the laser light to a sample and combine light scattered from the sample with light scattered from the reference reflector; and a detector in optical communication with the interferometer that receives the combination of light scattered from the sample and the light scattered from the reference reflector and transforms the combination of light into an electronic signal comprising measurement data with respect to the sample.

9 Claims, 10 Drawing Sheets

(56) References Cited

U.S. PATENT DOCUMENTS

| | | | |
|---|---|---|---|
| 6,485,413 B1 | 11/2002 | Boppart et al. | |
| 6,501,551 B1 | 12/2002 | Tearney et al. | |
| 6,552,796 B2 | 4/2003 | Magnin et al. | |
| 6,564,087 B1 | 5/2003 | Pitris et al. | |
| 6,570,659 B2 | 5/2003 | Schmitt | |
| 6,696,898 B1 | 2/2004 | Ward et al. | |
| 6,706,004 B2 | 3/2004 | Tearney et al. | |
| 6,870,629 B1 | 3/2005 | Vogel et al. | |
| 6,879,851 B2 | 4/2005 | McNamara et al. | |
| 6,891,984 B2 | 5/2005 | Petersen et al. | |
| 7,061,622 B2 | 6/2006 | Rollins et al. | |
| 7,157,712 B2 | 1/2007 | Flanders et al. | |
| 7,208,333 B2 | 4/2007 | Flanders et al. | |
| 7,231,243 B2 | 6/2007 | Tearney et al. | |
| 7,241,286 B2 | 7/2007 | Atlas | |
| 7,375,812 B2 | 5/2008 | Atia et al. | |
| 7,406,107 B2 | 7/2008 | Flanders et al. | |
| 7,414,779 B2 | 8/2008 | Huber et al. | |
| 7,415,049 B2 | 8/2008 | Flanders et al. | |
| 7,482,589 B2 | 1/2009 | Flanders et al. | |
| 7,534,990 B2 | 5/2009 | Yao | |
| 7,538,935 B2 | 5/2009 | Gaeta et al. | |
| 7,625,366 B2 | 12/2009 | Atlas | |
| 7,813,609 B2 | 10/2010 | Petersen et al. | |
| 7,848,791 B2 | 12/2010 | Schmitt et al. | |
| 7,916,387 B2 | 3/2011 | Schmitt et al. | |
| 7,935,060 B2 | 5/2011 | Schmitt et al. | |
| 7,949,019 B2 | 5/2011 | Bouma et al. | |
| 8,358,461 B2 | 1/2013 | Huber et al. | |
| 2002/0161351 A1 | 10/2002 | Samson et al. | |
| 2003/0103212 A1* | 6/2003 | Westphal | A61B 3/102 356/479 |
| 2004/0027225 A1* | 2/2004 | Lee | B81B 3/0051 337/36 |
| 2005/0201662 A1 | 9/2005 | Petersen et al. | |
| 2005/0238067 A1 | 10/2005 | Choi | |
| 2006/0072632 A1 | 4/2006 | Flanders et al. | |
| 2006/0095065 A1 | 5/2006 | Tanimura et al. | |
| 2006/0203859 A1 | 9/2006 | Cable et al. | |
| 2006/0244973 A1 | 11/2006 | Yun et al. | |
| 2008/0165366 A1* | 7/2008 | Schmitt | A61B 5/0066 356/519 |
| 2009/0046295 A1 | 2/2009 | Kemp et al. | |
| 2009/0059970 A1 | 3/2009 | Atia et al. | |
| 2009/0059971 A1 | 3/2009 | Atia et al. | |
| 2009/0174931 A1 | 7/2009 | Huber et al. | |
| 2009/0306520 A1 | 12/2009 | Schmitt et al. | |
| 2010/0076320 A1 | 3/2010 | Petersen et al. | |
| 2010/0094127 A1 | 4/2010 | Xu | |
| 2010/0103426 A1 | 4/2010 | Kim et al. | |
| 2010/0103964 A1 | 4/2010 | Huber | |
| 2010/0253949 A1 | 10/2010 | Adler et al. | |
| 2010/0272432 A1 | 10/2010 | Johnson | |
| 2011/0007315 A1 | 1/2011 | Petersen et al. | |
| 2011/0051143 A1 | 3/2011 | Flanders et al. | |
| 2011/0071404 A1 | 3/2011 | Schmitt et al. | |
| 2011/0071405 A1 | 3/2011 | Judell et al. | |
| 2011/0101207 A1 | 5/2011 | Schmitt | |
| 2011/0151980 A1 | 6/2011 | Petroff | |
| 2011/0157686 A1 | 6/2011 | Huber et al. | |
| 2011/0172511 A1 | 7/2011 | Schmitt et al. | |
| 2011/0178413 A1 | 7/2011 | Schmitt et al. | |
| 2011/0190586 A1 | 8/2011 | Kemp | |
| 2011/0216325 A1 | 9/2011 | Schmitt | |
| 2011/0222563 A1 | 9/2011 | Bouma et al. | |
| 2011/0228280 A1 | 9/2011 | Schmitt et al. | |
| 2012/0026505 A1 | 2/2012 | Atia et al. | |
| 2012/0057157 A1 | 3/2012 | Petersen et al. | |
| 2012/0162659 A1 | 6/2012 | Goldberg et al. | |
| 2012/0236883 A1 | 9/2012 | Adler | |
| 2012/0238869 A1 | 9/2012 | Schmitt et al. | |
| 2012/0250028 A1 | 10/2012 | Schmitt et al. | |
| 2012/0310081 A1 | 12/2012 | Adler et al. | |
| 2013/0010303 A1 | 1/2013 | Petersen et al. | |
| 2013/0012811 A1 | 1/2013 | Schmitt et al. | |
| 2013/0023761 A1 | 1/2013 | Petroff | |
| 2013/0051728 A1 | 2/2013 | Petroff | |
| 2013/0072805 A1 | 3/2013 | Schmitt et al. | |

OTHER PUBLICATIONS

Choma et al., "Sensitivity advantage of swept source and Fourier domain optical coherence tomography", Opt. Express, vol. 11: 2183-2189 (2003).

* cited by examiner

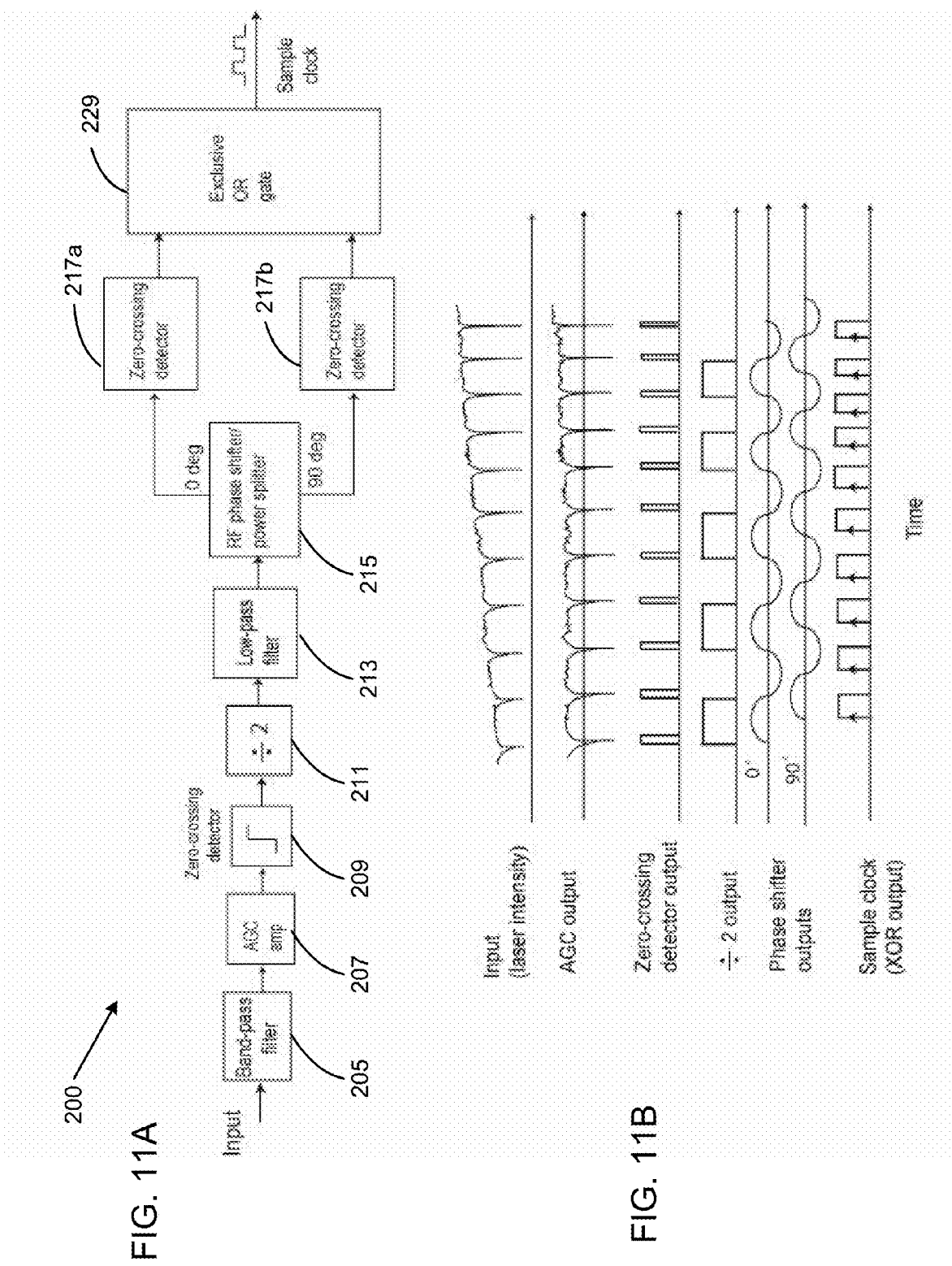

SWEPT MODE-HOPPING LASER SYSTEM, METHODS, AND DEVICES FOR FREQUENCY-DOMAIN OPTICAL COHERENCE TOMOGRAPHY

CROSS REFERENCE TO RELATED APPLICATIONS

This application is a continuation of U.S. application Ser. No. 13/195,234, filed on Aug. 1, 2011, the entire disclosure of which is incorporated by reference herein.

FIELD OF INVENTION

In part, this invention relates to light sources and associated devices and methods for interferometric data collection systems, such as optical coherence tomography systems.

BACKGROUND

Frequency-domain optical coherence tomography (FD-OCT) systems employ light generated by a source such as a laser to collect data with respect to a sample. This data can be used to form cross-sectional images of biological tissue and other samples. Typically, lasers with fixed cavity lengths longer than 50 cm are used in FD-OCT systems. These fixed long-cavity length laser are relatively easy to construct using conventional fiber or free-space optical components.

When tuned over a wide band of wavelengths, lasers with fixed cavity lengths traverse longitudinal modes spaced by an optical frequency interval equal to $\Delta v = c/2L$, where L is the length of the laser cavity. Therefore, the longer the laser cavity, the more modes are available to sustain laser oscillation within a given optical tuning bandwidth. For example, when tuning over the wavelength range of 1260-1360 nm (238-221 THz), the typical operating range of lasers employed in FD-OCT systems, a laser with a fixed cavity length of 50 cm (longitudinal mode spacing=0.33 GHz) traverses more than 56000 modes. During a rapid sweep over such a large number of modes, intensity fluctuations are smoothed by the finite response time of the optical amplifier.

Unfortunately, tunable long-cavity lasers also have several significant disadvantages as FD-OCT light sources. Because of the long photon residence time inside the laser cavity, these lasers suffer from a severe trade-off between scanning speed and coherence length. Typically, the sweep repetition rate of such lasers is limited to 10-20 KHz at imaging depths greater than a few millimeters. Tunable long-cavity lasers also tend to be bulky and difficult to mass produce at low cost.

In light of the foregoing, there is a need for other types of lasers and related signal processing methods that are suitable for use in FD-OCT systems that overcome these disadvantages.

SUMMARY OF THE INVENTION

In one embodiment, the invention relates to methods and systems that include short-cavity lasers, such as lasers having a cavity length of between about 0.3 and about 2 cm. Such lasers are suitable for use in frequency-domain optical coherence tomography (FD-OCT) systems provided that one or more deficiencies related to mode hopping can be overcome or mitigated. The various short-cavity laser embodiments are swept or tunable lasers in one embodiment. In one embodiment, the cavity length of a given laser embodiment is adjustable. Further, in one embodiment, a shorter cavity length is achieved by avoiding the inclusion of two or more lenses or focusing elements. Thus, for example, in some laser embodiments of the invention, the laser cavity defines a volume within which light passes. While in the cavity, the light can pass through a single lens or focusing element. Alternatively, in some embodiments there are no lenses in the cavity.

In part, the methods and laser embodiments described herein take advantage of the short lifetime of photons within the cavity of semiconductor mode-hopping lasers, which permits fast sweep speeds and high repetition rates. Sweep rates as high as about 100 nm/µs with bi-directional repetition rates of about 500 KHz are possible using the embodiments described herein. In one embodiment, mode-hopping refers to a phenomenon in which the wavelength (or frequency) increases or decreases depending on conditions and design parameters of the laser. In one embodiment, mode hopping occurs as a result of transitions between different modes of in the laser cavity.

Preferred laser embodiments are described that produce short transition times (<about 1 ns) between modes at typical sweep rates. As a result, these short transition times permit brief intensity fluctuations at the laser output. These intensity fluctuations occur as the wavelength of the laser is tuned. In turn, these fluctuations serve as synchronization pulses for acquisition of FD-OCT interference signals. Furthermore, if the cavity length of the laser is chosen such that the mode-hop frequency of the laser equals the Nyquist sampling frequency of the OCT system, or an exact multiple thereof, nearly artifact-free OCT imaging can be achieved using such lasers.

In one embodiment, the mode-hopping laser has a cavity length within the ranges specified herein and the laser includes a gain medium and a wavelength-tunable filter interposed between one reflecting and one partially reflecting reflector such as a mirror. To reduce mode-hopping noise, in one embodiment, the optical length of the laser cavity is chosen to equal a small multiple of, such as for example one or two times, a scanning range of the OCT system such as the maximum scanning range of the OCT system. For example, the scanning range of OCT systems for imaging coronary arteries is in the range of about 0.5 to about 1 cm in free space.

Embodiments of the invention also relate to various circuits, signal processing elements, and clock generators. A portion of the output of the laser is detected, converted to an electronic signal, and processed by a clock generator that synchronizes the timing of the acquisition of the interference signals. Thus, in some embodiments, various systems, lasers, and sample clock generators, components thereof, and related methods are described for implementing high-performance FD-OCT systems. In a preferred embodiment, such FD-OCT systems include tunable short-cavity mode-hopping lasers as light sources. These lasers can be used in conjunction with a data collection probe, a reflector, and an interferometer.

In one embodiment the cavity length of the laser is less than about 1 cm. In one embodiment, the range for the cavity length is between about 0.3 and about 2 cm, and more preferably between about 0.5 and about 2 cm, and generally preferred to be between about 0.7 and about 1.0 cm or less than about 1.0 cm.

In one embodiment, the invention relates to a frequency-domain optical coherence tomography system. The system can include a tunable laser comprising a laser output for transmitting laser light and a laser cavity having a length L; a gain element disposed within the laser cavity; a tunable wavelength selective element disposed within the laser cavity; and a reference reflector disposed outside of the laser cavity, wherein L is greater than or equal to a maximum scanning depth of frequency-domain optical coherence tomography system $d_{max}$ and wherein L is less than about 10 mm. In one embodiment, the gain element is a semiconductor optical amplifier with one reflecting facet and one angled facet and the tunable wavelength selective element is a tunable reflection-mode Fabry-Perot etalon. The system can further include a lens that couples light from the semiconductor optical amplifier into the tunable etalon; and a single mode fiber with a tapered proximal tip that couples light out of the angled facet of the semiconductor optical amplifier.

In another embodiment, the gain element is a semiconductor optical amplifier with one reflecting facet and one angled facet with an anti-reflection coating and the tunable wavelength selective element is a tunable transmission-mode Fabry-Perot etalon. The etalon can include a segment of coreless optical fiber comprising a reflecting surface and an angled surface, a single-mode fiber with a reflecting proximal end that also couples light out of laser, a piezoelectric actuator that oscillates the proximal end of the single-mode fiber. The system can also include a lens that couples light from the semiconductor optical amplifier into the angled surface of the coreless optical fiber. The gain element can include a semiconductor optical amplifier having one reflecting facet and one angled facet and the tunable wavelength selective element is a tunable transmission-mode Fabry-Perot etalon. In one embodiment, the etalon can include a segment of coreless optical fiber with one reflecting end and a tapered end that couples light from the angled facet of the semiconductor optical amplifier, a single-mode fiber with a reflecting proximal end that also couples light out of laser. In addition, in one embodiment, the system can further include a piezoelectric actuator that oscillates the proximal end of the single-mode fiber. The optical frequency of the tunable laser can be swept continuously at repetition rates over a wavelength range. In one embodiment, the tunable laser is configured to oscillate in discrete longitudinal modes, except during a fraction of a time interval between modes.

In one embodiment, a longitudinal mode spacing of the tunable laser is $$\Delta v = c/4Md_{max},$$

wherein M=1, 2, 3, 4, or 5. In one embodiment of the system, the laser cavity has a finesse that ranges from about 2 to about 5. In one embodiment, the gain element is a first semiconductor optical amplifier configured to receive a first injection current and further comprising a first frequency modulator configured to apply a first modulation frequency greater than or equal to about 1 Ghz to the first injection current.
In one embodiment, the system can include a second semiconductor optical amplifier in optical communication with the first semiconductor optical amplifier and disposed outside of the laser cavity, wherein the second semiconductor amplifier is configured to receive a second injection current; and a second frequency modulator configured to apply a second modulation frequency greater than or equal to about 1 GHz to the second injection current.

In one embodiment, the system can include a synchronous clock generator. The system of claim 11 wherein the clock generator is configured to generate a sample clock comprising sample pulses having an edge in response to centers of intervals between mode transition signals of the laser. The clock generator can include a bandpass filter; an automatic gain control element in electrical communication with the bandpass filter; a zero-crossing detector in electrical communication with the automatic gain control element; a digital divide-by-two circuit in electrical communication with the zero-crossing detector; a low-pass filter in electrical communication with the digital divide-by-two circuit; a power splitter in electrical communication with the low-pass filter; a frequency doubler in electrical communication with the power splitter, the frequency doubler comprising a first zero-crossing detector and a second zero-crossing detector; and an exclusive-OR gate in electrical communication with both the first zero-crossing detector and the second zero-crossing detector.

In one embodiment, the clock generator can include a bandpass filter; an automatic gain control element in electrical communication with the bandpass filter; a zero-crossing detector in electrical communication with the automatic gain control element; a digital divide-by-two circuit in electrical communication with the zero-crossing detector; and a phase-locked loop frequency multiplier in electrical communication with the divide-by-two circuit, wherein the multiplier generates clock pulses having edges aligned with a center of an interval between a mode hop of the laser. The system can also include a coupler in optical communication with the laser, wherein the mode-transition signals are received from the coupler.

In one embodiment, the system can include a Mach-Zehnder interferometer in optical communication with the coupler, wherein the mode-transition signals are filtered by a Mach-Zehnder interferometer connected in optical communication with the coupler. In one embodiment, the Mach-Zehnder interferometer can include a first path having a first length and a second path having a second length, wherein a difference between the first length and the second length is selected to filter low-frequency baseline fluctuations of laser intensity and pass at least one peak frequency of the mode-transition signals. The system can also include an analog-to-digital converter that samples and digitizes interference signals in response to each edge. In addition, the system can include a balanced interferometer have a first path and a second path, a first photoamplifier in optical communication with the first path of the balanced interferometer and a second photoamplifier in optical communication with the second path of the balanced interferometer wherein the mode-transition signals are derived from a sum of outputs of the first and second photoamplifiers.

In one embodiment, the system can include an interferometer in optical communication with the laser output and the reference reflector, wherein the interferometer is configured to transmit a portion of the laser light to a sample and combine light scattered from the sample with light scattered from the reference reflector; and a detector in optical communication with the interferometer that receives the combination of light scattered from the sample and the light scattered from the reference reflector and transforms the combination of light into an electronic signal comprising measurement data with respect to the sample.

In one embodiment, the cavity length L can range from about 3 mm to about 9 mm and 1.5 mm≤$d_{max}$≤about 4.5 mm. In addition, the cavity length L ranges from about 3 mm to less than 10 mm. L can be less than $2Md_{max}$, wherein M ranges from about 1 to about 5 in one embodiment. In one embodiment of the system, about 7 GHz≤$\Delta v$≤about 25 GHz and a coherence length of the tunable laser coherence length is greater than or equal to $2d_{max}$.

In one embodiment, the system can include a control system in electrical communication with the tunable laser and an optical coherence tomography probe in optical communication with the tunable laser wherein the control system is configured to cause the probe to collect data from a sample of interest between two mode hops.

In one embodiment, the invention relates to a method of collecting optical coherence tomography data from a sample of interest. The method includes reducing mode hopping in a tunable laser in optical communication with a sample arm of an interferometer; collecting the optical coherence tomography data during a time period T using a probe in optical communication with the sample arm; and determining the time period T using a clock generator in electrical communication with the tunable laser such that the T period occurs between mode hops of the tunable laser. The method can include reducing a cavity length L of the tunable laser such L is less than about 10 mm. In one embodiment of the method the laser can include a semiconductor optical amplifier and further comprising modulating a charge carrier density in the semiconductor optical amplifier during the collection of the optical coherence tomography data.

In one embodiment, the invention relates to a synchronous clock generator. The clock generator can include a bandpass filter; an automatic gain control element in electrical communication with the bandpass filter; a zero-crossing detector in electrical communication with the automatic gain control element; a digital divide-by-two circuit in electrical communication with the zero-crossing detector; and a low-pass filter in electrical communication with the digital divide-by-two circuit; a RF 0°/90° power splitter filter in electrical communication with the low-pass filter; a frequency doubler in electrical communication with the power splitter, the frequency doubler comprising a first zero-crossing detector and a second zero-crossing detector; and an exclusive-OR gate in electrical communication with both the first zero-crossing detector and the second zero-crossing detector.

In one embodiment, the invention relates to a synchronous clock generator. The clock generator can include a bandpass filter; an automatic gain control element in electrical communication with the bandpass filter; a zero-crossing detector in electrical communication with the automatic gain control element; a digital divide-by-two circuit in electrical communication with the zero-crossing detector; and a phase-locked loop frequency multiplier in electrical communication with the divide-by-two circuit, wherein the multiplier generates clock pulses having edges aligned with a center of an interval between a mode hop of a laser having a cavity length L.

This Summary is provided merely to introduce certain concepts and not to identify any key or essential features of the claimed subject matter.

BRIEF DESCRIPTION OF THE DRAWINGS

The figures are not necessarily to scale, emphasis instead generally being placed upon illustrative principles. The figures are to be considered illustrative in all aspects and are not intended to limit the invention, the scope of which is defined only by the claims.

FIG. 11A is a block diagram of a synchronous sample clock generator and a corresponding timing diagram in accordance with an illustrative embodiment of the invention.

FIG. 11B is a diagram showing the relative timing of the components of FIG. 11A in accordance with an illustrative embodiment of the invention.

DETAILED DESCRIPTION

Figure 1:
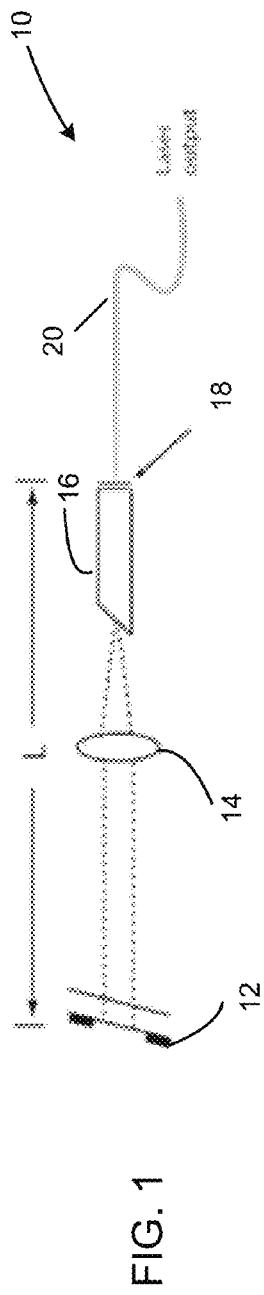
FIG. 1 is a schematic diagram of a laser that includes a reflection-mode etalon in accordance with an illustrative embodiment of the invention.

The following description refers to the accompanying drawings that illustrate certain embodiments of the invention. Other embodiments are possible and modifications can be made to the embodiments without departing from the spirit and scope of the invention. Therefore, the following detailed description is not meant to limit the present invention. Rather, the scope of the present invention is defined by the appended claims.

In one embodiment, lasers having parameters selected to improve their suitability for use as FD-OCT light sources and/or their ease of manufacture are described. These lasers can include a laser cavity such as for example an external cavity. For example, such a laser can include a gain element such as a semiconductor optical amplifier (SOA), an internal filter such as Fabry-Perot filter, one or two mirrors, and a small number of lenses such that some or all of these elements are disposed within or define the length of the laser's cavity. The length of the cavity L is specified by various ranges recited herein. In various embodiments, reference is made to SOAs as suitable gain elements. However, the invention is not so limited and various amplifiers, gain elements, or other devices that amplify light can be used in lieu of or in addition to a SOA in a given embodiment.

If the cavity of the laser is made sufficiently short, narrow linewidths can be maintained at high sweep speeds. However, as a consequence of the wide separation between their longitudinal cavity modes, short-cavity lasers tend to 'mode hop', i.e., tune in discontinuous wavelength steps. These mode hops generate intensity and phase variations in the output light from the laser that can severely degrade the interference signals acquired by FD-OCT imaging systems. Moreover, the long coherence lengths of such lasers, although an advantage for imaging deep structures, can exacerbate imaging artifacts caused by parasitic reflections within optical components of OCT systems.

In summary, although short-cavity mode-hopping lasers have a number of potentially attractive features as light sources for high-speed FD-OCT systems, their poor noise performance must be addressed. In part, the present invention relates to various mode-hopping lasers embodiments, methods and systems that are suitable for use in FD-OCT systems, as well as for effective methods for processing signals generated by such lasers that address this noise performance issue.

Although many different types of broadband tunable lasers have been developed for use in spectroscopic and interferometric sensing systems, only certain lasers are suitable for use in the methods and systems described herein. Various design parameters of interest relating to the lasers used in such methods and systems follow below. As used herein, the term "short-cavity lasers" refers to the laser embodiments having a cavity with a length L that is selected from the various cavity lengths described herein.

First, dynamic operation of the laser is configured to favor single-mode operation at discrete optical frequencies separated by $$\Delta v = c/4Md_{max},$$

where $d_{max}$ is the desired maximum scanning depth of the frequency-domain OCT system and M=1, 2, . . . is small whole number, typically no more than 4 or 5. Another way of stating this requirement is that the length of the laser cavity, L, is equal to $2Md_{max}$. In one embodiment, when using a FD-OCT systems for biomedical applications, about Error! Objects cannot be created from editing field codes. mm, about Error! Objects cannot be created from editing field codes. GHz, and about Error! Objects cannot be created from editing field codes. mm. Second, the transition time between modes is selected such that it is short enough that it occupies only a small fraction (typically about 0.2 or smaller) of the inter-modal sweep interval. Third, the dynamic coherence length of the laser is configured to exceed or equal 2 $d_{max}$. Some or all of these features can be implemented using the embodiments described herein.

Figure 2:
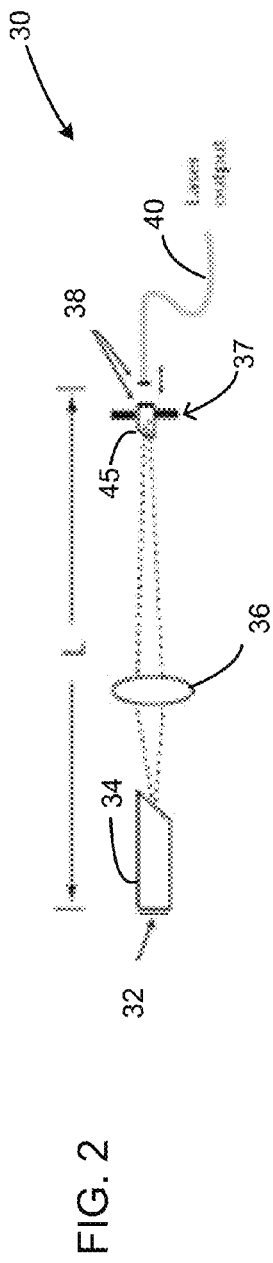
FIG. 2 is a schematic diagram of an embodiment of a laser that includes a transmission-mode etalon in accordance with an illustrative embodiment of the invention.
Figure 3:
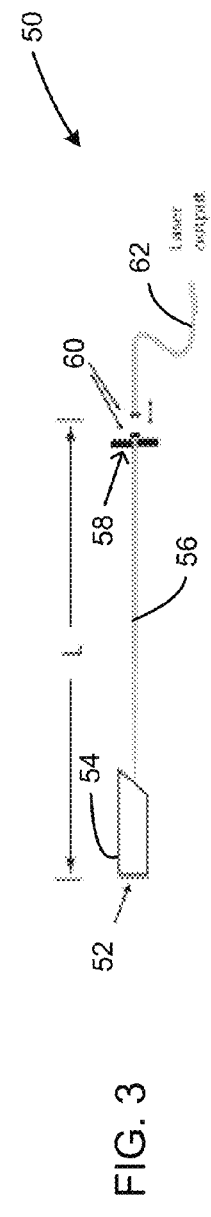
FIG. 3 is a schematic diagram of an embodiment of a laser having a lens-free configuration in accordance with an illustrative embodiment of the invention.

FIGS. 1-3 illustrate sources of electromagnetic radiation 10, 30, and 50, respectively. Each source has a cavity length L that range from about 0.5 to about 2 cm or other cavity lengths as described herein (including any one value within a range of values). In addition, these sources are designed for simplified fabrication. Each of these sources is a non-limiting example of a laser.

With respect to FIG. 1, the laser embodiment 10 shown includes a SOA 16, with one partially reflecting facet 18, and a etalon 12. In one embodiment, the etalon 12 is a tunable reflection-mode Fabry-Perot etalon. A lens 14 is also disposed in the cavity. The length of the laser cavity L is set by the distance between the partially reflecting surface 18 of the SOA and one surface of the etalon 12. A tapered fiber 20 couples the light out of the partially reflecting facet 18 of the SOA. In one embodiment, this laser 10 only includes a single lens 14. As a result, the cavity length L can be reduced relative to a cavity with additional lenses or other elements disposed therein. In addition, this design makes alignment easier, and reduces the internal reflections from the surfaces of the lens. In one embodiment, L ranges from about 0.5 to about 2 cm.

Another embodiment of a short-cavity laser 30, shown in FIG. 2, includes a SOA 34, with one reflecting facet 32, and an etalon 37. In one embodiment, the etalon 37 operates in the transmission mode. The etalon can be a tunable fiber-optic Fabry-Perot etalon. A lens 36 is disposed in the cavity. An optical fiber 40 is also optically in communication with SOA 34. The length of the laser cavity L is set by the distance between the partially reflecting surface 32 of the SOA and the reflective coating 38 on the tip of the optical fiber 40 that forms one surface of the etalon. One advantage of this laser embodiment 30 is that it includes a tunable etalon 37, which is based on a piezo-actuated optical fiber 45 instead of a pair of electrostatically actuated plates. With respect FIG. 2, in one embodiment, L also ranges from about 0.5 to about 2 cm.

Similar to the embodiment of FIG. 1, only one lens 36 is used. This follows because the optical fiber 40 also couples light out of the laser. In one specific embodiment, a short segment of coreless optical fiber 45 with a reflecting coating 38 on one end forms the fixed surface of the etalon. The optical fiber 40 also includes such a coating 38 which forms the other surface of the etalon. The reflective coatings on the fiber segment 45 and optical fiber 40 can be the same or different in various embodiments. The other end of the fiber segment 45 is polished at an angle to reduce back reflection. The length of the fiber segment 45 can range from about 0.05 to about 1 cm. The fiber segment 45 can be mounted using various supports and alignment devices. The cross-sectional profile of the coated end of the fiber 45 can be either flat or concave, according to the desired properties of the etalon. Other similar embodiments based on a block of silicon or other transparent materials for the etalon 37 are also possible.

Another embodiment of a short-cavity laser 50 is shown in FIG. 3. This laser embodiment 50 eliminates lenses or other intra-cavity focusing elements entirely. An etalon 58 is disposed within the cavity. A short segment of single-mode fiber 56, with one tapered end, transmits light from the non-reflecting facet of a SOA 54 to the input of the etalon 58. In one embodiment, the reflecting facet 52 of the SOA can define one end of the cavity. The etalon can be an optical fiber-based Fabry-Perot etalon. The fiber segment 56 can be mounted using various supports and alignment devices. The reflective coatings on the fiber segment 56 and optical fiber 62 can be the same or different in various embodiments. The coating on optical fiber 62 defines a reflective surface with respect to which the cavity length L can be measured. The cavity length L can be measured as shown in FIGS. 1-3.

With respect to FIG. 3, the untapered end of the fiber 56, on which a reflecting coating 60 is deposited, forms the input surface of the etalon 58. As with the embodiment illustrated in FIG. 2, the cross-sectional profile of the coated end of the fiber 62 can be either flat or concave, according to the desired properties of the etalon. The length of the fiber segment 56 can range from about 0.2 to about 2 cm. The length of the cavity L is set by the distance between the partially reflecting surface 52 of the SOA 54 and the reflective coating 60 on the tip of the optical fiber 62 that forms the output surface of the etalon. With respect FIG. 3, in one embodiment, L ranges from about 0.3 to about 2 cm. In one embodiment, L ranges from about 0.3 to less than 1 cm. In one embodiment, L is less than or equal to about 7 mm.

In one embodiment, the fibers 20, 40 and 62 shown in the embodiments described herein are optional, and the coatings applied thereto can be applied to another transmissive or partially reflecting element. As such, these fibers 20, 40, and 62 can be replaced with a lens, a gap, or other elements for coupling laser light into a data collection system such as an OCT system. In one embodiment, two or more of the elements disposed in the cavity are glued or fused together. These elements may be positioned such that an air gap remains between them while being connected together. The gluing or fusing of two or more elements in the cavity can be performed using fiber coupling and fusion techniques know in the telecommunications industry.

The gain element disposed within the cavity can be a SOA as shown and described herein. A secondary SOA can be positioned outside of the cavity such that it is in optical communication with the primary SOA disposed in the cavity. In one embodiment, the SOA has an electrical contact suitable for receiving a frequency modulated injection current. Thus, the embodiments of FIGS. 1-3 can include a current source and/or a frequency modulator that causes an injection current applied to the primary SOA and/or the secondary SOA to undergo a high-frequency (>1 GHz) modulation. Additional details on this point are provided below with respect to FIGS. 5A and 5B.

Regardless of which configuration a laser embodiment is based upon, the optical elements shown and described herein are fabricated in accordance with one or more of the parameters and requirements described herein, such as the length L. In particular, the bandwidth of the tunable etalon relative to the laser cavity mode spacing is an important parameter. This parameter influences the mode-hopping characteristics of the laser. In one embodiment, the bandwidth of a tunable etalon used herein ranges from about 3 to about 15 GHz.

Figure 4:
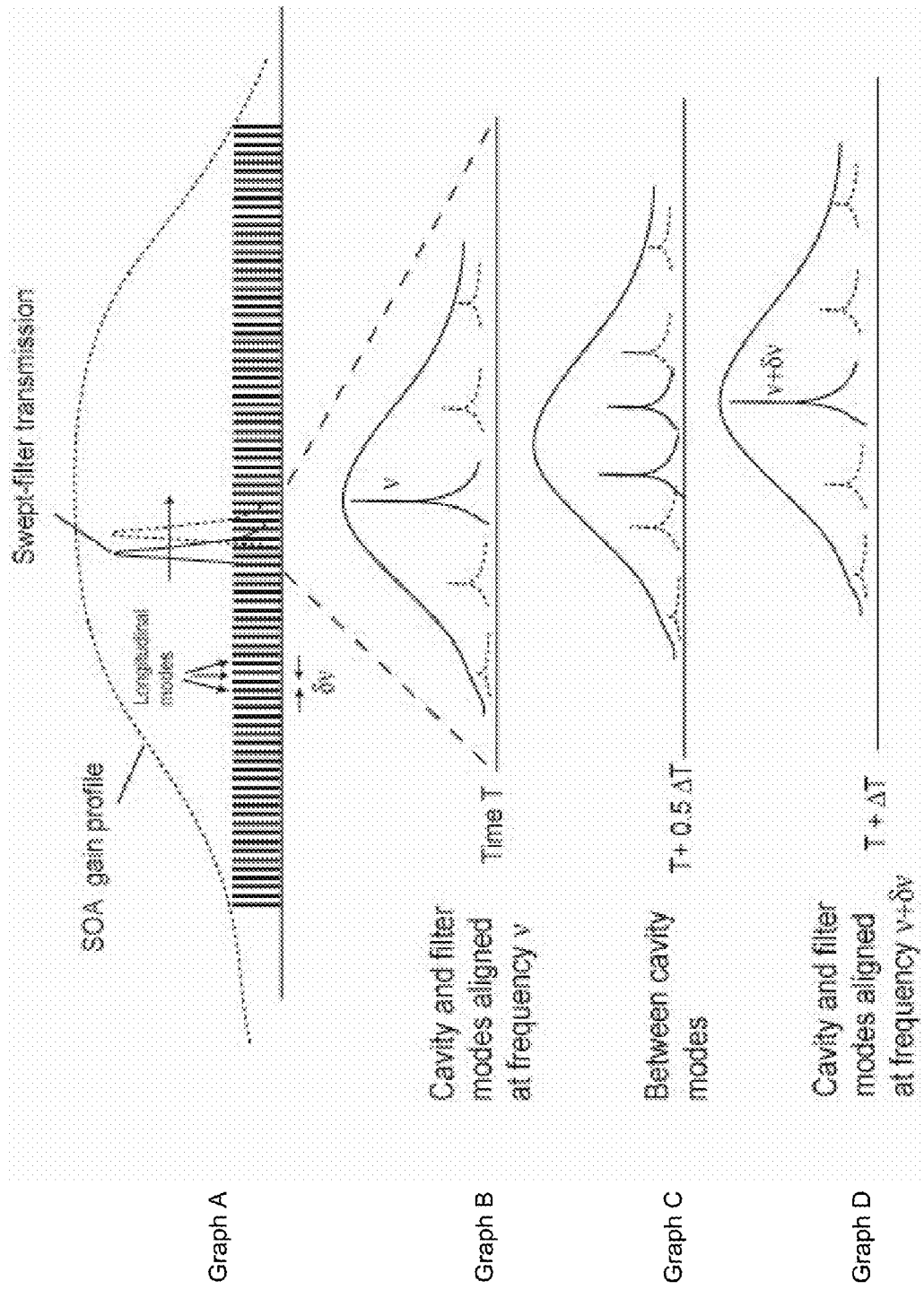
FIG. 4 is a schematic diagram that illustrates the mode-hopping behavior of a laser configured in accordance with an illustrative embodiment of the invention.

As illustrated by the diagrams in FIG. 4, the filter bandwidth should be wide enough to allow the laser to operate in a single-mode as the tunable filter sweeps between adjacent modes, except during a brief interval in which adjacent modes compete, the phase of the laser oscillation changes rapidly and the gain collapses. Various longitudinal modes are shown in FIG. 4 as narrow frequency bands (short vertical lines) and the swept-filter transmission is shown as a band of optical frequencies with a smooth transmission profile. Graph A illustrates sweeping of the filtered gain spectrum across the longitudinal cavity modes. Graph B shows amplification of a single cavity mode at optical frequency ν during an interval in which the passbands of the filter and cavity are aligned. Graph C shows the condition in which adjacent longitudinal modes with the cavity compete for cavity gain. Complete power switching between modes occurs during an interval on the order of the carrier recombination time of the laser. Mode competition at time $T+0.5\Delta T$ midway between the steps produces a momentary reduction of coherent intensity with an accompanying shift in phase. In addition, Graph D shows amplification of the next higher order cavity mode at optical frequency $\nu+\Delta\nu$ during the interval in the sweep in which the passbands of the filter and cavity are again aligned.

In one embodiment, the bandwidth of the tunable etalon is on the order of the mode spacing, and its free-spectral range is selected to exceed the desired tuning range of the laser. Since the gain of the laser cavity must be high enough to sustain oscillation over a large fraction of the sweep interval between modes, in one embodiment the finesse of the laser cavity is limited to small values. For example, in one embodiment the finesse of the laser cavity ranges from about 2 to about 20.

Consider a laser configured according to the present invention for a typical FD-OCT application with a maximum scanning depth of about 6 mm and a tuning range of about 1260-about 1360 nm. For L=about 12 mm, a typical range of values of the bandwidth and finesse of the etalon would be about 6-18 GHz and about 1000-3000, respectively. If coupling losses in the cavity are kept low and the SOA gain exceeds about 20 dB, these conditions permit single-mode operation to be maintained at high sweep rates (>about 20 nm/μs) for a laser cavity finesse in the range of about 2 to about 5.

The coherence length of short-cavity lasers described herein can exceed several tens of centimeters. Although advantageous in many applications, such as three dimensional surface profiling, long coherence length can also pose difficulties in other applications. For example, spurious reflections from optical components in the OCT system can generate aliases that corrupt the interference signals from the sample of interest. Therefore, reducing the coherence length of the mode-hopping laser is desirable for certain OCT applications. For example, for coronary imaging with OCT, the preferred range for coherence length is typically greater than about 16 mm, but less than about 40 mm.

Figure 5:
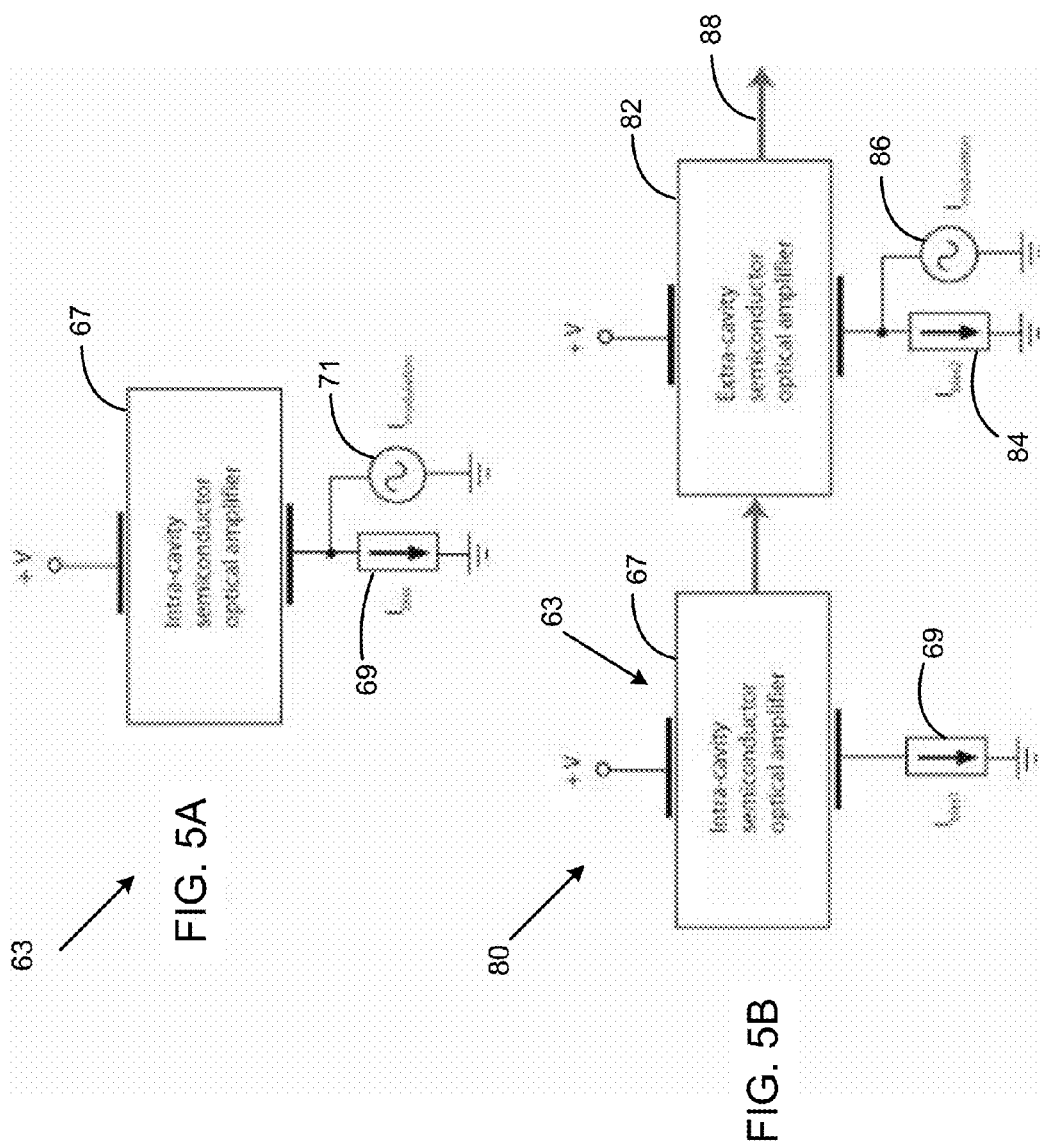
FIG. 5A is a schematic diagram of a subsystem incorporating a gain element that reduces the coherence length of the laser in accordance with an illustrative embodiment of the invention.
FIG. 5B is a schematic diagram of a subsystem incorporating a primary gain element and a booster or secondary gain element that reduces the coherence length of the laser accordance with an illustrative embodiment of the invention.

FIG. 5A illustrates a subsystem 63 that includes a gain element in the form of a SOA 67 disposed within the laser cavity. In one embodiment, this SOA 67 is referred to as a first or a primary SOA. The subsystem 63 includes electrical elements in communication with the SOA 67. Specifically, an applied voltage V is applied to the SOA. A current source 69 having a current such as a bias current $I_{bias}$ is shown. The current can be modulated by a frequency modulator 71. The frequency modulated current can be applied to the SOA as an injection current. As a result, the SOA can be addressed at one or more electrical contacts or inputs with this injection current $I_{bias}$ as a signal to limit the coherence length of the laser incorporating the SOA. This selective coherence length control is achieved by frequency modulation of the injection current $I_{bias}$ of the SOA in the laser cavity. The frequencies used are typically greater than or equal to about 1 GHz.

Specifically, FIG. 5A shows a subsystem 63 that includes a primary SOA 67 that is in electrical communication with a current source 69 that is controlled by a frequency modulator 71. The modulation, applied at frequencies much greater than the maximum frequency of the interference signals measured by the OCT system, induces changes in the injected carrier density within the SOA. This effect is the same whether applied to an intra-cavity or an extra-cavity SOA. These changes in carrier density, in turn, induce refractive index changes that broaden the linewidth of the laser. To be effective, in one embodiment, the modulation index of the applied waveform typically exceeds 25% and its frequency exceeds a substantial fraction of the longitudinal mode spacing of the cavity Δν.

For example, to limit the coherence length of a short-cavity mode-hopping laser with a longitudinal mode spacing of Δν=10 GHz to a few centimeters, 50% modulation of the SOA current at frequencies above 1 or 2 GHz is typically required. The shape of the modulation waveform is preferably triangular, but sinusoidal, square-wave, or aperiodic (noiselike) modulation patterns can also be employed. This method can be used with various short-cavity length laser embodiments such those of FIGS. 1-3.

FIG. 5B illustrates an alternative embodiment of subsystem 80 that reduces the coherence length of the laser. This coherence length reduction is achieved by modulating the injection current of a booster or secondary SOA 82. The injection current $I_{bias2}$ flows from a current source 84. The secondary SOA 82 is in optical communication with the primary SOA 67 and the output of the laser 88. As with direct modulation of the primary SOA 67 with $I_{bias1}$, the modulation of a booster SOA 82 is achieved using a frequency modulator 86. The applied frequency modulation also broadens the emission linewidth by inducing a modulation of the carrier density in the active region of the SOA 82 which, in turn, modulates the refractive index of the waveguide. Requirements similar to the aforementioned requirements for modulation of the primary SOA 67 can also apply to the frequency and amplitude of the modulation waveform applied to a booster SOA 82. The use of an external booster SOA 82, with or without modulation applied, also allows higher output powers to be achieved for lasers with lower cavity gains and finesses.

Figure 6:
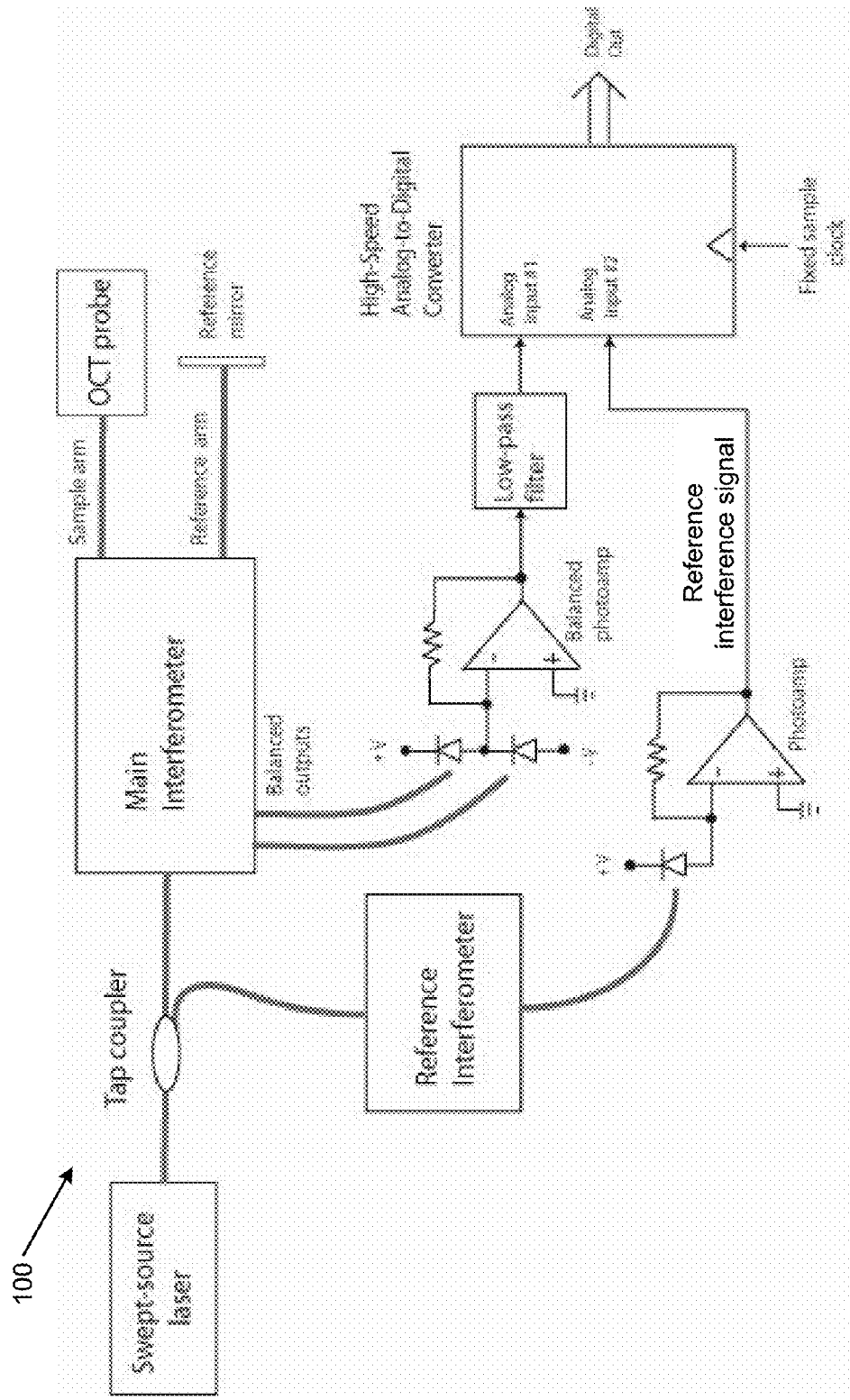
FIG. 6 is a block diagram of a conventional frequency-domain optical coherence tomography system that includes a non-mode hopping laser having a long cavity length.

FIG. 6 is a block diagram of a conventional frequency-domain optical coherence tomography (FD-OCT) system 100 that employs a swept-source laser as a light source as known to the prior art. The interference signal and an optical clocking signal, derived from a reference interferometer, are acquired simultaneously at a fixed sample rate by an analog-to-digital converter.

To compensate for non-linearities in the sweep rate of the laser in optical-frequency space, the digitized interference signal is interpolated and re-sampled at the repetition rate (or at a multiple of the repetition rate) of the optical clock signal. This re-sampling process ensures that the interference signal is sampled at uniform optical frequency intervals prior to Fourier transformation. In one embodiment, the re-sampling process interpolates the signals acquired with the fixed clock to obtain the values that would have been acquired if the A/D converter had been sampled at a frequency proportional to the zero-crossings of the reference interferometer fringes.

The conventional FD-OCT system of FIG. 6 performs poorly when a short-cavity mode-hopping laser is employed as the light source, because intensity and phase variations during mode hops severely degrade the interference signals when the OCT signal is sampled during a time interval close to a mode hop. This noise problem can be overcome using the methods and apparatus described herein such as by synchronizing the acquisition of FD-OCT interference signals, such that the interference signals are sampled during an interval when the laser emission is stable. Thus, an optical coherence probe in optical communication with a tunable laser that is subject to mode hops can be controlled using a suitable control system such as a clock generator to collect OCT data from a sample of interest when a mode hop is not occurring such as between mode hops or near a mode hop. A time period T or a plurality of time periods T can thus be determined initially or on a periodic basis during which OCT data can be collected. Preferably, a short cavity laser embodiment is used as described herein to reduce the number of mode hops that occur such that the level of mode hopping noise that would otherwise be present in the OCT data is further reduced.

Figure 7:
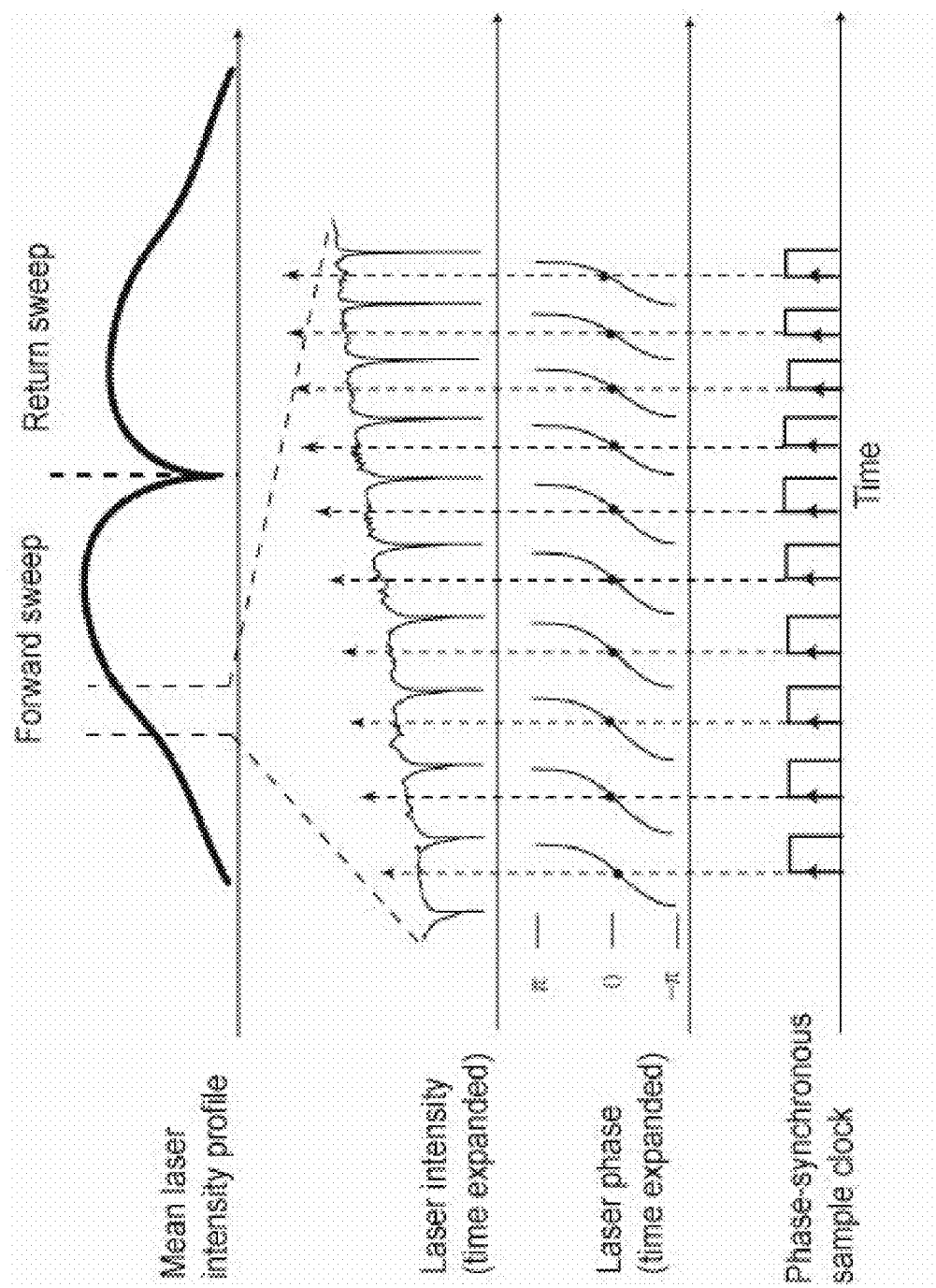
FIG. 7 is a schematic diagram showing a laser output amplitude and phase changes observed during continuous wavelength tuning of a laser designed in accordance with an illustrative embodiment of the invention.

FIG. 7 shows typical laser output amplitude and phase changes observed during continuous wavelength tuning of a short-cavity laser configured according to the invention. As illustrated in this figure, a phase-synchronous sample clock acquires data in the middle of the time interval between mode hops when the phase passes through zero. Analog-to-digital conversion is initiated at one of the edges of the sample clock. This is the time when the phase and intensity fluctuations are smallest. In one embodiment, the time when such fluctuations are the smallest occurs within a range of times such as one or more temporal ranges defined by at the minimum slope of the phase variations and the maximal distances from dips in the laser intensity due to mode hops.

Figure 8:
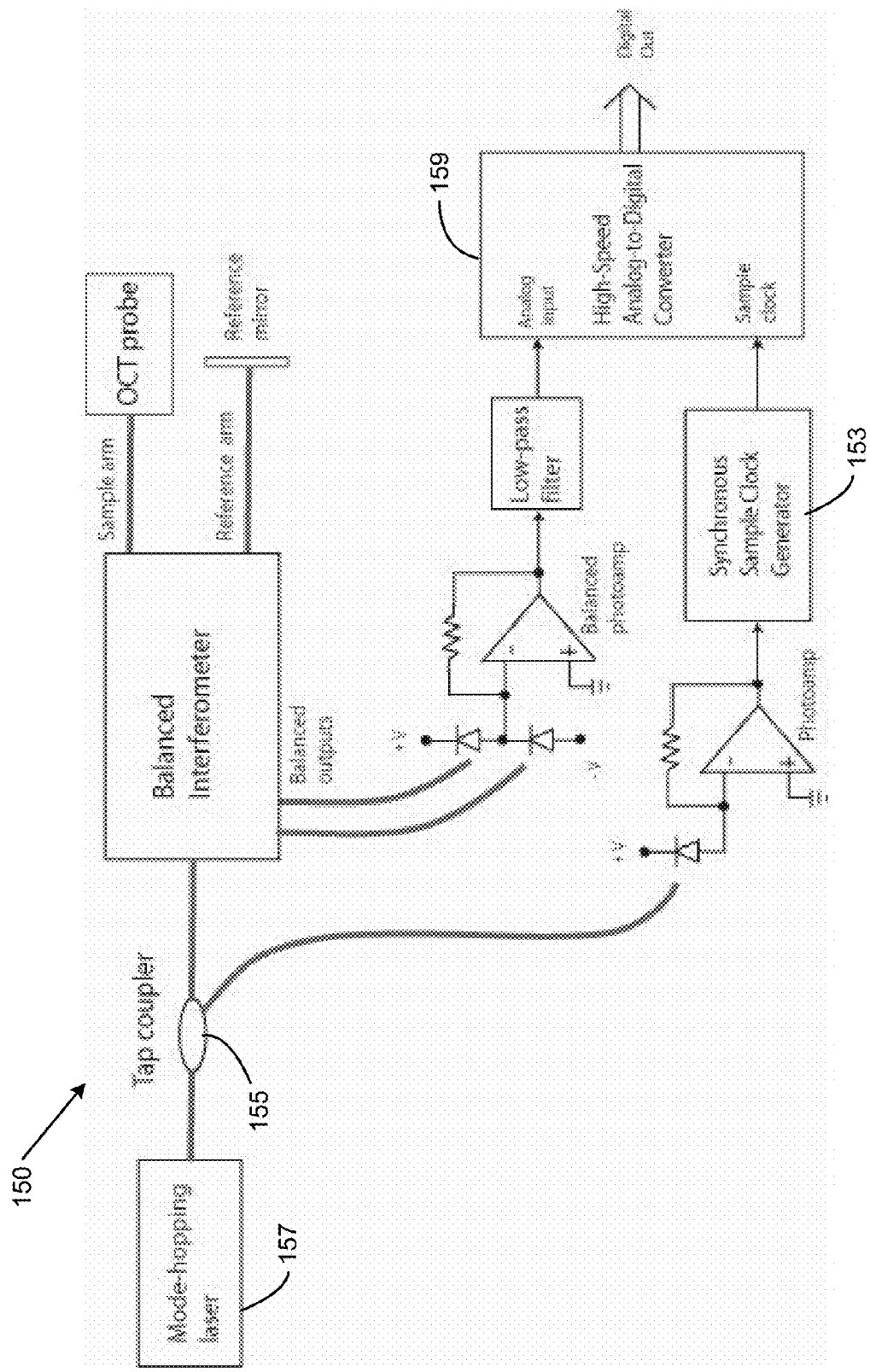
FIG. 8 is a block diagram of a frequency-domain optical coherence tomography system that includes a mode-hopping laser as a light source in accordance with an illustrative embodiment of the invention.

FIG. 8 shows one of the embodiments of a mode-hopping FD-OCT system 150 that incorporates a synchronous sample clock generator 153 to acquire OCT interference signals. The system is configured such that light from a coupler 155, such as a tap coupler, in optical communication with the laser 157 is processed to generate a clock for synchronous sampling of OCT signals from a balanced interferometer. In this embodiment, light from the coupler 155 in optical communication with the laser 157 is converted to an electrical signal which is then processed to generate a clock for synchronous sampling of the interference signals. In this embodiment, precise matching (typically within +/−0.1 ns) of the electro-optical delays of the signal and clock paths from the laser to the analog-to-digital converters 159 is desirable.

Figure 9:
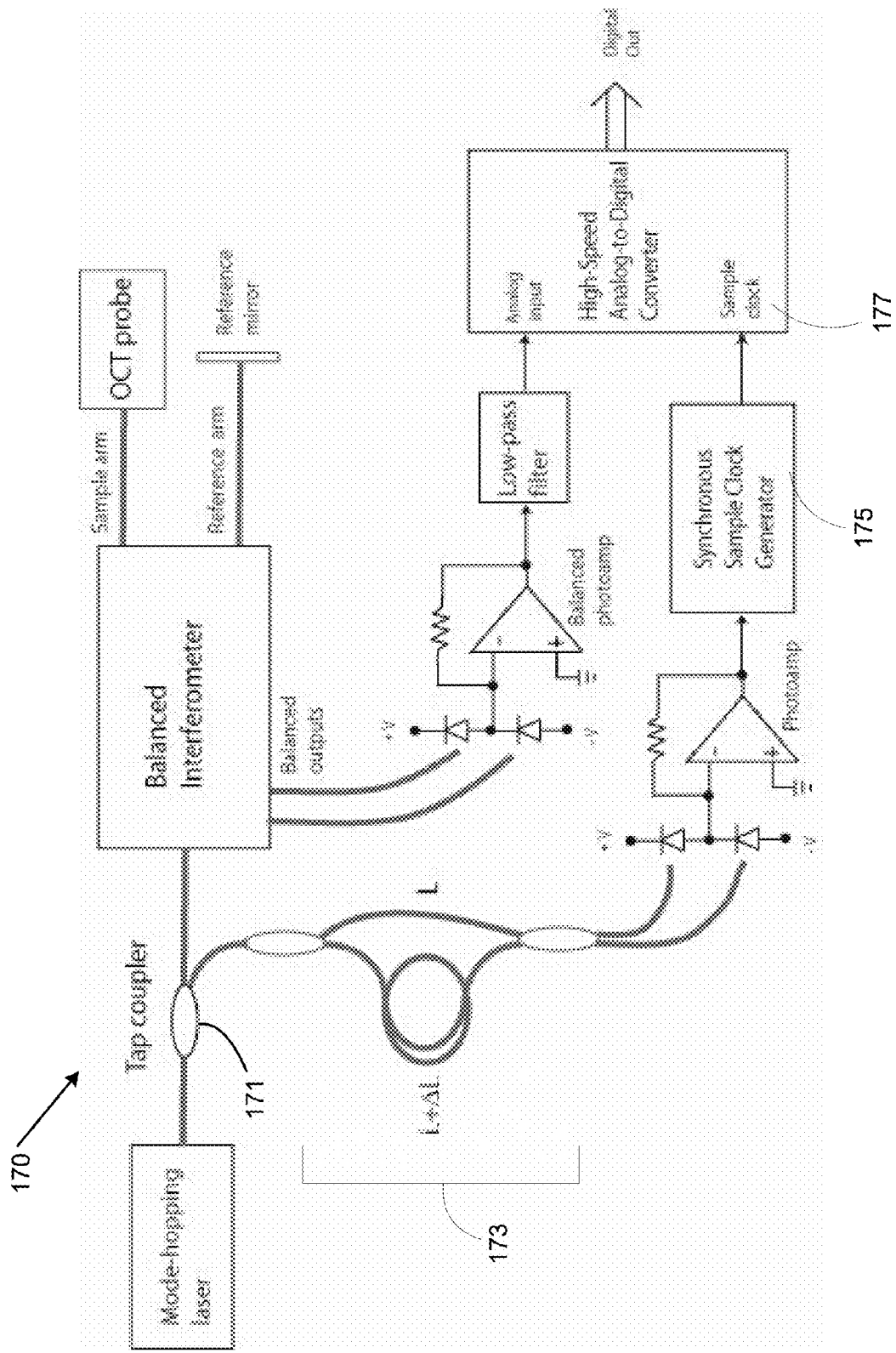
FIG. 9 is a block diagram of a frequency-domain optical coherence tomography system in accordance with an illustrative embodiment of the invention.

FIG. 9 shows an alternative embodiment of a mode-hopping FD-OCT system 170 that includes a coupler 171 and Mach-Zehnder interferometer 173 for enhancing the amplitude of the mode-transition signals. The interferometer includes a first path or leg and a second path or leg, each path having different lengths L and ΔL, respectively. It is from these signals that the clock generator 175 generates the synchronous sample clock 177. Specifically, this enhancement of the amplitude of the mode-transition signals improves detection and synchronization. The difference between the lengths of the two paths of Mach-Zehnder interferometer 173, ΔL, is chosen to filter the low-frequency baseline fluctuations of the laser intensity, while passing the peak frequency, $f_p$, of the mode-transition signals. Typically, ΔL values are selected such that it ranges between about 10 cm to about 50 cm, for laser sweep rates>about 10 nm/μs. In this embodiment, the elements are selected and arranged to match the electro-optical delays of the signal and clock paths from the laser to the analog-to-digital converters.

Figure 10:
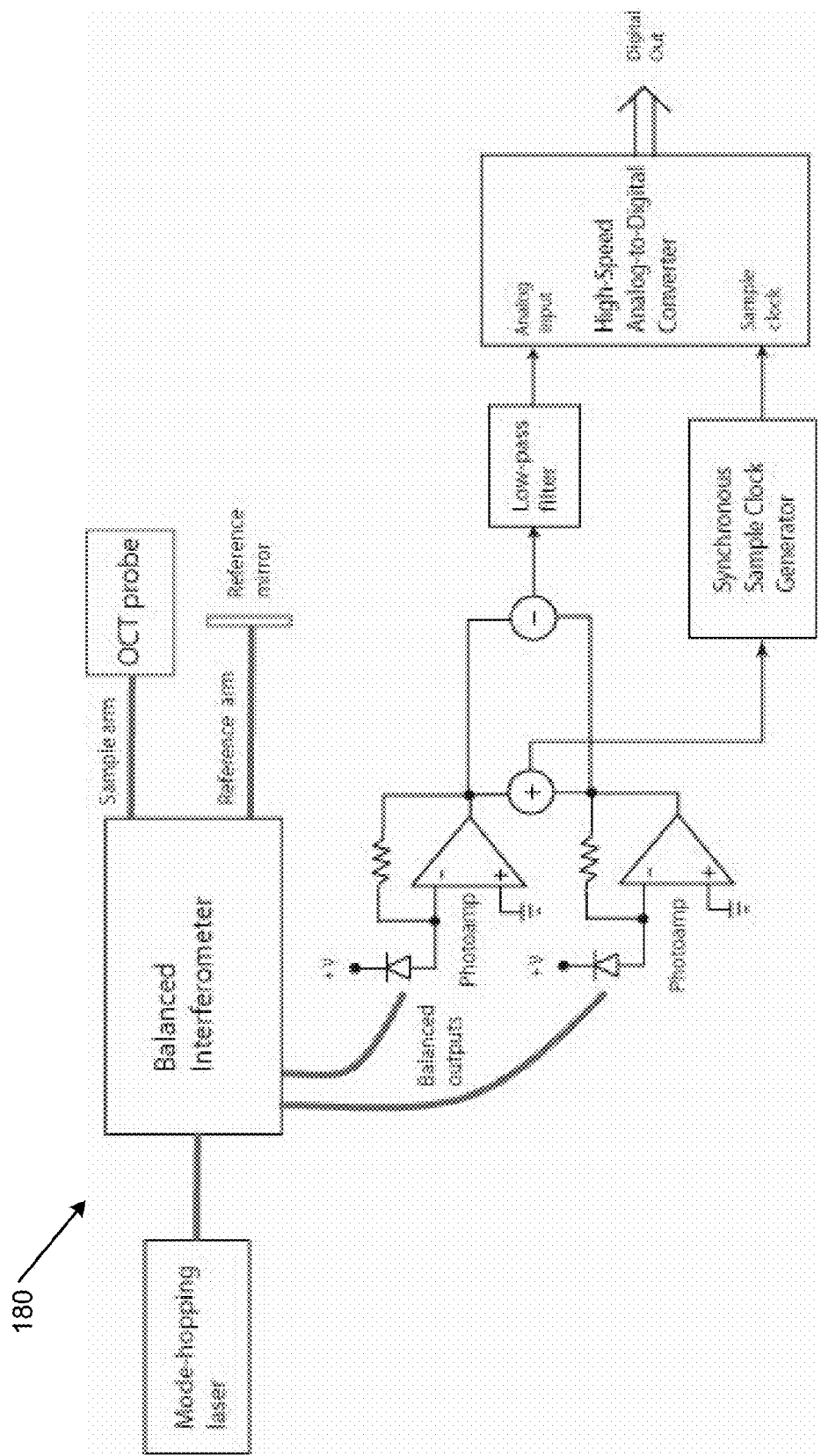
FIG. 10 is a block diagram of a frequency-domain optical coherence tomography system in accordance with an illustrative embodiment of the invention.

A further embodiment of a mode-hopping FD-OCT system 180 is shown in FIG. 10. In this embodiment, the mode-transition signals from which the synchronous sample clock is generated are derived from the sum of the outputs of the photoamplifiers connected to the two legs or paths of the balanced interferometer. This configuration eliminates the need for a separate laser coupler and facilitates matching of the electro-optical delays of the signal and clock paths from the laser to the analog-to-digital converters.

Another aspect of the present invention is the implementation of the synchronous sample clock generator. This clock generator can be a component of the mode-hopping FD-OCT systems shown and/or described herein. FIG. 11A shows a block diagram of such an exemplary clock generator 200. FIG. 11B shows the corresponding timing diagram of an embodiment of the synchronous sample clock generator 200 of FIG. 11A.

As shown in FIG. 11A, the clock generator 200 forms sample pulses with leading edges that align with the centers of the intervals between mode hops. The intensity signals from the laser are subjected to a series of linear and non-linear signal-processing steps that form digital pulses from phase-shifted sine waves synchronized with the instantaneous mode-hopping frequency.

Specifically, as shown in FIG. 11A, a band-pass filter 205 receives an input from a tap coupler at the output of the laser. Once the input is filtered by the band-pass filter 205, a first filtered signal is transmitted to an automatic gain control (AGC) amplifier 207. An amplified signal is then transmitted to a first zero crossing detector 209. A divide-by-two circuit or signal processing element 211 is in electrical communication with the zero-crossing detector 209. This element 211 reduces the amplitude of the signal by 50% before transmitting to a low pass filter 213. This second filter 213 transmits a second filtered signal to a phase shifting or power splitting element 215. In one embodiment, this element 215 splits the second filtered signal into first and second split signals that are 90 degrees out of phase with each other. Each of the first and second split signals are then received by second and third zero crossing detectors, 217a and 217b. The two resulting outputs from each of the detectors 217a and 217b are then transmitted to a gate 229 such as an exclusive OR gate. The output of the gate 229 is a sample clock signal. In one embodiment, this configuration doubles the frequency of the divide-by-two output to restore the frequency to the mode-hop frequency, but with a 90 degree phase shift. In turn, the phase shift places an edge of the clock in the middle of the mode hops.

In FIG. 11B, narrow pulses produced by mode transitions are extracted with a band-pass filter, amplified and normalized with a fast-responding automatic gain control (AGC) amplifier or element 207, and then passed through a zero-crossing detector 209 that forms digital pulses synchronized with the edges of the mode transitions. The frequency of these pulses is divided by two (Stage 211) by a high-speed flip-flop or other element, which produces a digital pulse train with a 50% duty cycle. This digital pulse train is converted to a sine wave by a low-pass filter 213 with a cut-off frequency at approximately twice the maximum repetition rate of the mode-transition signals. An analog frequency doubler, which includes an RF 0°/90° phase shifter 215, two zero-crossing detectors 217a, 217b, and an exclusive-OR gate 229, produces a sample clock with edges aligned with the centers of the mode-transition zero-crossings. This implementation can accommodate non-linear laser sweeps that generate mode-hopping frequencies over a wide frequency range.

Figures 12A, 12B:
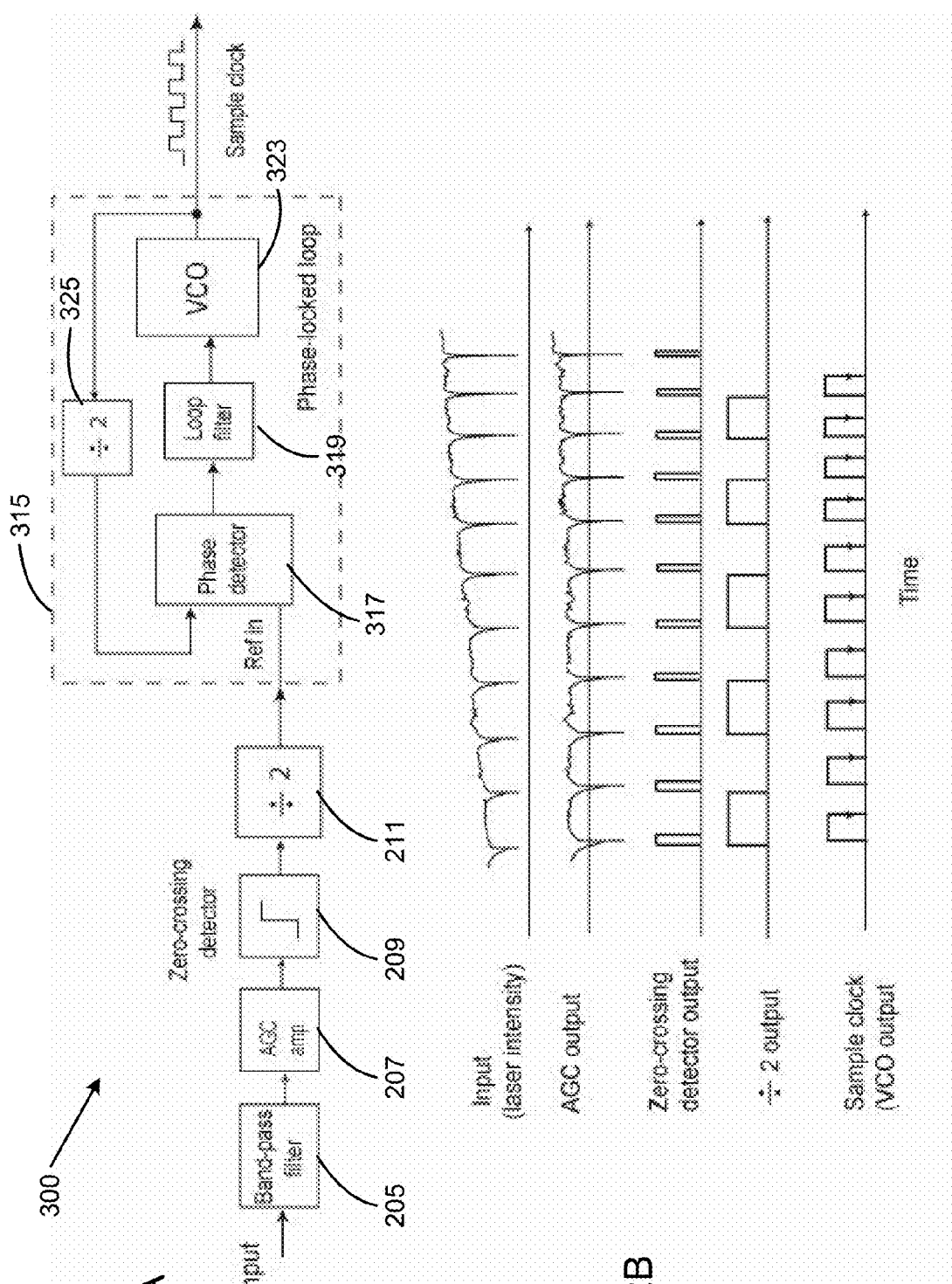
FIG. 12A depicts a block diagram of another embodiment of a synchronous sample clock generator in accordance with an illustrative embodiment of the invention.
FIG. 12B is a diagram showing the relative timing of the components of FIG. 12A in accordance with an illustrative embodiment of the invention.

FIG. 12A shows a block diagram of a clock generator 300 and a corresponding timing diagram (FIG. 12B). These figures illustrate another embodiment of the synchronous sample clock generator. The elements shown in FIG. 12A include the same elements of FIG. 11A up until the divide-by-two circuit or element 211. This embodiment is based on a phase-locked loop 315 that forms sample clock pulses with trailing edges that align with the centers of the intervals between mode hops. The phase locked loop receives a reference input from the divide-by-two circuit or element 211. Thus, except for the final frequency doubler stages, this embodiment employs signal-processing similar to those of FIG. 11A. This embodiment has better jitter performance; however, it is not able to track instantaneous frequency variations as accurately for lasers with highly non-linear sweeps. The phase locked loop 315 includes a phase detector 317 that is in electrical communication with a loop filter 319. In turn, this loop filter 319 is in electrical communication with a voltage controlled oscillator (VCO) 323. The output of the VCO 323 either exits the loop 315 as a sample clock once processed by the filters and other stages in the loop 315 or continues to a second divide-by-two circuit or element 325 before returning to the phase detector 317.

In the description, the invention is discussed in the context of optical coherence tomography; however, these embodiments are not intended to be limiting and those skilled in the art will appreciate that the invention can also be used for other imaging and diagnostic modalities or optical systems in general.

The terms light and electromagnetic radiation are used interchangeably herein such that each term includes all wavelength (and frequency) ranges and individual wavelengths (and frequencies) in the electromagnetic spectrum. Similarly, the terms device and apparatus are also used interchangeably. In part, embodiments of the invention relate to or include, without limitation: sources of electromagnetic radiation and components thereof; systems, subsystems, and apparatuses that include such sources; mechanical, optical, electrical and other suitable devices that can be used as part of or in communication with the foregoing; and methods relating to each of the forgoing. Accordingly, a source of electromagnetic radiation can include any apparatus, matter, system, or combination of devices that emits, re-emits, transmits, radiates or otherwise generates light of one or more wavelengths or frequencies.

One example of a source of electromagnetic radiation is a laser. A laser is a device or system that produces or amplifies light by the process of stimulated emission of radiation. Although the types and variations in laser design are too extensive to recite and continue to evolve, some non-limiting examples of lasers suitable for use in embodiments of the invention can include tunable lasers (sometimes referred to as swept source lasers), superluminescent diodes, laser diodes, semiconductor lasers, mode-locked lasers, gas lasers, fiber lasers, solid-state lasers, waveguide lasers, laser amplifiers (sometimes referred to as optical amplifiers), laser oscillators, and amplified spontaneous emission lasers (sometimes referred to as mirrorless lasers or superradiant lasers).

The aspects, embodiments, features, and examples of the invention are to be considered illustrative in all respects and are not intended to limit the invention, the scope of which is defined only by the claims. Other embodiments, modifications, and usages will be apparent to those skilled in the art without departing from the spirit and scope of the claimed invention.

The use of headings and sections in the application is not meant to limit the invention; each section can apply to any aspect, embodiment, or feature of the invention.

Throughout the application, where compositions are described as having, including, or comprising specific components, or where processes are described as having, including or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes," "including," "have," "has," or "having" should be generally understood as open-ended and non-limiting unless specifically stated otherwise.

The use of the singular herein includes the plural (and vice versa) unless specifically stated otherwise. Moreover, the singular forms "a," "an," and "the" include plural forms unless the context clearly dictates otherwise. In addition, where the use of the term "about" is before a quantitative value, the present teachings also include the specific quantitative value itself, unless specifically stated otherwise.

It should be understood that the order of steps or order for performing certain actions is immaterial so long as the present teachings remain operable. Moreover, two or more steps or actions may be conducted simultaneously.

Where a range or list of values is provided, each intervening value between the upper and lower limits of that range or list of values is individually contemplated and is encompassed within the invention as if each value were specifically enumerated herein. In addition, smaller ranges between and including the upper and lower limits of a given range are contemplated and encompassed within the invention. The listing of exemplary values or ranges is not a disclaimer of other values or ranges between and including the upper and lower limits of a given range.

It is to be understood that the figures and descriptions of the invention have been simplified to illustrate elements that are relevant for a clear understanding of the invention, while eliminating, for purposes of clarity, other elements. Those of ordinary skill in the art will recognize, however, that these and other elements may be desirable. However, because such elements are well known in the art, and because they do not facilitate a better understanding of the invention, a discussion of such elements is not provided herein. It should be appreciated that the figures are presented for illustrative purposes and not as construction drawings. Omitted details and modifications or alternative embodiments are within the purview of persons of ordinary skill in the art.

It can be appreciated that, in certain aspects of the invention, a single component may be replaced by multiple components, and multiple components may be replaced by a single component, to provide an element or structure or to perform a given function or functions. Except where such substitution would not be operative to practice certain embodiments of the invention, such substitution is considered within the scope of the invention.

The examples presented herein are intended to illustrate potential and specific implementations of the invention. It can be appreciated that the examples are intended primarily for purposes of illustrative of the invention for those skilled in the art. There may be variations to these diagrams or the operations described herein without departing from the spirit of the invention. For instance, in certain cases, method steps or operations may be performed or executed in differing order, or operations may be added, deleted or modified.

Furthermore, whereas particular embodiments of the invention have been described herein for the purpose of illustrating the invention and not for the purpose of limiting the same, it will be appreciated by those of ordinary skill in the art that numerous variations of the details, materials and arrangement of elements, steps, structures, and/or parts may be made within the principle and scope of the invention without departing from the invention as described in the claims.

What is claimed is:

1. A frequency-domain optical coherence tomography system comprising:
    a first interferometer in optical communication with a tunable laser;
    a coupler in optical communication with the tunable laser;
    a synchronous clock generator comprising a frequency multiplier configured to generate a sample clock comprising sample pulses in response to an interval between mode transition signals of the tunable laser, wherein one or more sample pulses have an edge aligned with a center of an interval between a mode hop of the tunable laser; and
    an analog-to-digital converter that samples and digitizes interference signals in response to the sample clock, the interference signals generated by the first interferometer in response to light from the tunable laser and light received from an optical coherence tomography probe.

2. The frequency-domain optical coherence tomography system of claim 1 wherein the tunable laser is a tunable short-cavity laser.

3. The frequency-domain optical coherence tomography system of claim 1 further comprising the tunable laser, wherein the tunable laser has a laser cavity having a length L that is less than about 10 mm.

4. The frequency-domain optical coherence tomography system of claim 1 further comprising the tunable laser, wherein the tunable laser has a laser cavity having a length L, wherein L is greater than or equal to a maximum scanning depth of frequency-domain optical coherence tomography system $d_{max}$.

5. The frequency-domain optical coherence tomography system of claim 1 further comprising the tunable laser, wherein a longitudinal mode spacing of the tunable laser is $$\Delta \upsilon = c/4Md_{max},$$

wherein M=1, 2, 3, 4, or 5.

6. The frequency-domain optical coherence tomography system of claim 1 further comprising a second interferometer.

7. The frequency-domain optical coherence tomography system of claim 6 wherein the second interferometer is a Mach-Zehnder interferometer in optical communication with the coupler, wherein the mode-transition signals are filtered by a Mach-Zehnder interferometer connected in optical communication with the coupler.

8. The system of claim 7 wherein Mach-Zehnder interferometer comprises a first path having a first length and a second path having a second length, wherein a difference between the first length and the second length is selected to filter low-frequency baseline fluctuations of laser intensity and pass at least one peak frequency of the mode-transition signals.

9. The frequency-domain optical coherence tomography system of claim 1 wherein the synchronous clock generator comprises:
    a bandpass filter;
    an automatic gain control element in electrical communication with the bandpass filter;
    a zero-crossing detector in electrical communication with the automatic gain control element;
    a digital divide-by-two circuit in electrical communication with the zero-crossing detector; and a phase-locked loop frequency multiplier in electrical communication with the divide-by-two circuit, wherein the multiplier generates clock pulses having edges aligned with a center of an interval between a mode hop of a laser having a cavity length L.

* * * * *